United States Patent [19]

Phipps et al.

[11] 4,120,995
[45] Oct. 17, 1978

[54] PROCESS FOR BONDING A DURABLE LOW SURFACE ENERGY COATING

[75] Inventors: Peter Beverley Phipps, Saratoga; Bhim Sain Sharma, San Jose, both of Calif.; Anthony Wai Wu, Fishkill, N.Y.

[73] Assignee: International Business Machines Corporation, Armonk, N.Y.

[21] Appl. No.: 843,194

[22] Filed: Oct. 18, 1977

[51] Int. Cl.$^2$ ............................................. C23C 13/04
[52] U.S. Cl. ........................... 427/248 A; 148/6.14 R; 148/6.27; 427/248 E; 427/255; 427/302; 427/314; 427/318
[58] Field of Search ................... 427/387, 248 E, 301, 427/302, 318, 327, 248 A, 314, 255; 148/6.3, 6.14 R, 6.27; 428/450, 421, 422, 429, 447; 260/448.2 B

[56] References Cited

U.S. PATENT DOCUMENTS

| | | | |
|---|---|---|---|
| 3,422,131 | 1/1969 | Pittman et al. | 260/448.2 B |
| 3,935,349 | 1/1976 | Terai et al. | 427/387 X |

Primary Examiner—Ronald H. Smith
Assistant Examiner—Evan K. Lawrence
Attorney, Agent, or Firm—Joseph G. Walsh

[57] ABSTRACT

This invention is concerned with a process for bonding a durable low surface energy polymeric coating to a metal or oxide surface. The metal or oxide surface is first treated with an alkali, thereby maximizing the hydroxide ion concentration on the surface, and then in a rigorously dry state with a rigorously dry fluorinated material to form the polymeric coating. The fluorinated material has the formula $$Rf - O - (CH_2)_n - SiX_3$$

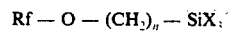

wherein $Rf$ is a fluorinated lower alkyl group, $n$ is an integer from 2 to 10, and X is a halogen, cyanide or alkoxy group.

6 Claims, No Drawings

PROCESS FOR BONDING A DURABLE LOW SURFACE ENERGY COATING

FIELD OF THE INVENTION

The present invention is concerned with a method of forming a durable low surface energy coating which is tightly bonded to a metal or oxide surface. By the process of the present invention a metal or oxide surface is tightly bonded to a coating containing fluorinated alkyl groups. The fluorinated alkyl groups impart to the coating durability and in particular low surface energy.

PRIOR ART

Fluorinated materials have been known in the past to be useful for a wide variety of applications due to their chemical inertness and low surface energy. The bonding of these materials to substrates remains a problem of considerable magnitude.

It has been known in the past to form a bond between a metal or oxide surface and a silicon containing material. Such procedures are shown, for example, in U.S. Pat. Nos. 3,445,265 and 3,935,349. Neither of these patents, however, is in any way concerned with fluorinated materials and is thus totally devoid of any teaching related to the present invention.

SUMMARY OF THE INVENTION

According to the present invention, a durable low surface energy coating is bonded to a metal or oxide substrate by first contacting the metal or oxide surface with an alkali to maximize the hydroxide ion concentration thereon and then contacting the rigorously dry surface with a material containing a fluorinated alkyl group linked by an ether linkage to an alkyl silane group. The materials useful in the present invention are those having the formula $$R_f - O - (CH_2)_n - SiX_3$$

wherein $R_f$ is a fluorinated lower alkyl group, $n$ in an integer from 2 to 10, and X is a halogen, cyanide or alkoxy group.

In carrying out the process of the present invention, the metal or oxide surface is treated with an alkali, for example sodium or potassium hydroxide, or preferably ammonium hydroxide, which serves to maximize the hydroxide ion concentration thereon. It is then treated in a rigorously dry state with a silane compound having the formula given above. When X is halogen, hydrogen halide is lost. When X is cyanide, hydrogen cyanide is lost, and when X is alkoxy, alcohol is lost, and the resulting condensation leads to the formation of a polymeric coating on the surface in which only fluorinated alkane groups are exposed. The siloxane is bound by multiple chemical bonds to the surface.

Metals useful in the present invention include, but are not limited to aluminum, iron, alloys such as nickel and iron, cobalt, chromium, silicon and titanium. The oxides include, but are not limited to iron oxide, silicon dioxide and glass.

During the treatment with alkali, it is preferred that the pH of the alkali be selected on the basis of the isoelectric point of the surface. Thus, the preferred minimum pH's for typical substrates are 8 for aluminum, chromium and iron, 9.5 for copper, 11 for cobalt, 12 for ferrous iron, 8 for ferric iron, 3 for silicon and 6.5 for titanium.

As examples of preferred silane compounds having the formula given above, the following may be mentioned: perfluoro-isopropoxy-propyl-trichloro silane; bis(perfluoro-isopropoxy-propyl)-dichloro-silane; and trifluoro-methoxyethyl-tri-isobutoxy silane.

It must be emphasized that it is absolutely essential to the success of the process that the reaction between the silane and the prepared surface take place under rigorously dry conditions. When moisture is not excluded from the surface, and from the carrier gas, thick layers of viscous and sticky material are produced. These layers are entirely unfavorable. The desired product is produced when, and only when, the gas and surface are rigorously dry.

The following example is given solely for purposes of illustration and is not to be considered a limitation on the invention, many variations of which are possible without departing from the spirit or scope thereof.

DESCRIPTION OF THE PREFERRED EMBODIMENT

A preferred embodiment of the present invention is as follows: The starting material is perfluoro-isopropoxy-propyl-trichloro-silane. This material is a liquid with a vapor pressure of about 30mm at 80° C. The vapor pressure at room temperature is very low. The material must be handled without exposure to water. The vapor over this liquid at room temperature is transported to a coating box by an inert dry carrier gas, for example nitrogen or a noble gas.

The metal or metal oxide surface to be coated is prepared by washing with a mixture of iso propyl alcohol and acetone at room temperature, followed by washing with distilled water, with ammonium hydroxide at pH 10, and then with distilled water again. All washings are carried out at room temperature and are of approximately 3 minutes duration. The surface is then dried rigorously by passing very dry nitrogen gas over the surface while it is heated to about 80° C.

The prepared surface is then placed in a deposition chamber and heated to about 80° C. This heating is conveniently accomplished by means of a heat lamp. The silane gas is introduced for 15 minutes using dry nitrogen gas as a carrier. The metal or metal oxide surface to be coated is maintained at 80° C. Excess silane gas is flushed out with dry nitrogen and the coated surface is then cooled in ambient air.

The resulting coating has a very low surface energy. The wetting angle for water is 105° ± 5° compared to 100° ± 5° for polytetrafluoroethylene. The coating is in the form of a very thin film less than about 50Å. The coating is insoluble in Freon. The fact that the coating is tightly bonded is also demonstrated by the fact that it is not removed by ultra high vacuum. Furthermore, the coating angle is not changed by prolonged exposure such as several hours contact with liquid water or 32 hours in air having a relative humidity of 80%.

When the coating was applied to a magnetic disk, it was not removed by rubbing a ferrite recording head in contact with the surface at high speed for 4 hours followed by starting and stopping the same head in a test designed to test the life performance of a recording disk. The surface does not have such a low surface energy that it cannot be lubricated. It is, however, extremely hydrophobic and this property reduces the tendency of water to displace the lubricant.

What is claimed is:

1. A process for bonding a durable low surface energy coating to a metal or oxide surface, said process comprising maximizing the hydroxide ion concentration on the surface by treating said surface with an alkali, rigorously drying said surface, and then contacting the rigorously dry surface with a rigorously dry material having the formula

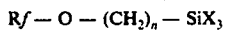

wherein $Rf$ is a fluorinated lower alkyl group, $n$ in an integer from 2 to 10, and X is halogen, cyanide or alkoxy group, thereby condensing the fluorinated material with the hydroxide ions on said surface.

2. A process as claimed in claim 1 wherein the alkali is ammonium hydroxide.

3. A process as claimed in claim 1 wherein the fluorinated material is contacted with the metal or oxide surface at a temperature of about 80° C.

4. A process as claimed in claim 1 wherein the fluorinated material is transported as a gas mixed with a dry inert gas carrier.

5. A process as claimed in claim 1 wherein the fluorinated material is perfluoro-isopropoxy-propyl-trichloro-silane.

6. A process for bonding a durable, low surface energy coating to a metal or metal oxide surface, said process comprising maximizing the hydroxide ion concentration on the surface by treating said surface with ammonium hydroxide, rigorously drying said surface and then contacting the rigorously dry surface at about 80° C. with rigorously dry perfluoro-isopropoxy-propyl-trichloro-silane in the vapor state mixed with dry nitrogen gas, thereby condensing the fluorinated material with the hydroxide ions on said surface.

* * * * *